US007852127B2

(12) United States Patent
Kitazawa et al.

(10) Patent No.: US 7,852,127 B2
(45) Date of Patent: Dec. 14, 2010

(54) DRIVING CIRCUIT FOR CAPACITIVE LOAD AND FLUID INJECTING DEVICE

(75) Inventors: Koji Kitazawa, Shiojiri (JP); Noboru Tamura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 35 days.

(21) Appl. No.: 12/363,446

(22) Filed: Jan. 30, 2009

(65) Prior Publication Data

US 2009/0189957 A1 Jul. 30, 2009

(30) Foreign Application Priority Data

Jan. 30, 2008 (JP) ............................ 2008-019671

(51) Int. Cl.
*H03B 1/00* (2006.01)

(52) U.S. Cl. ....................................... 327/112; 327/111

(58) Field of Classification Search ................. 327/111, 327/112

See application file for complete search history.

(56) References Cited

U.S. PATENT DOCUMENTS 5,742,193 A 4/1998 Colli et al.
5,994,942 A * 11/1999 Itoh .......................... 327/309
6,046,613 A * 4/2000 Tamura ...................... 327/108
6,154,069 A * 11/2000 Ebihara ...................... 327/112
6,242,970 B1 6/2001 Grant et al.
6,400,192 B2 * 6/2002 Boezen et al. .............. 327/112
6,531,895 B1 3/2003 Barrett et al.
6,759,880 B2 * 7/2004 Koch et al. .................. 327/112
6,836,173 B1 12/2004 Yang
7,049,863 B2 * 5/2006 Bechman et al. ............ 327/112
7,554,305 B2 6/2009 Nunokawa et al.
2009/0189453 A1 7/2009 Kitazawa et al.

FOREIGN PATENT DOCUMENTS

JP 2006-272907 10/2006

OTHER PUBLICATIONS

U.S. Appl. No. 12/363,451, mailed May 12, 2010, Office Action.

* cited by examiner

*Primary Examiner*—Hai L Nguyen
(74) *Attorney, Agent, or Firm*—Workman Nydegger

(57) ABSTRACT

A driving circuit that drives a capacitive load includes a drive signal generator that generates a drive signal that drives the capacitive load via a transistor pair in response to an analog signal. A power-source voltage generator generates high-voltage and low-voltage power-source voltages and supplies the power-source voltages to collectors of the transistors via a high-voltage output terminal and a low-voltage output terminal. The power-source voltage generator includes multiple power sources connected in parallel and a switch unit that connects the adjacent power sources in series each time the drive signal rises above or falls below a predetermined threshold value. The driving circuit further includes a voltage controlling capacitor connected to the low-voltage output terminal of the power source, and a power recovery unit having a switch unit that recovers a charge accumulated in the voltage controlling capacitor back to the power source via the high-voltage output terminal.

5 Claims, 5 Drawing Sheets

DRIVING CIRCUIT FOR CAPACITIVE LOAD AND FLUID INJECTING DEVICE

BACKGROUND

1. Technical Field

The present invention relates to a driving circuit for a capacitive load and a fluid ejecting device and, in particular, to an ink jet recording head that drives a piezoelectric element in response to a trapezoidal-wave drive signal and an ink jet recording device including the ink jet recording head.

2. Related Art

An ink jet recording device is known as a fluid ejecting device that ejects a fluid in response to a drive signal to a target for printing or other purposes. The ink jet recording device includes an ink jet recording head that ejects ink drops through a nozzle aperture in response to a pressure caused by a displacement of a piezoelectric element. Such a fluid ejecting device is supplied with a sufficient level of current to cause a large number of piezoelectric elements to operate smoothly. The fluid ejecting device thus uses a drive signal that is current-amplified by a current amplifier.

When the current amplifier current-amplifies a drive signal, a power consumption of a charging transistor is a product obtained from multiplying a current by a difference between a power source voltage and a voltage of the drive signal. On the other hand, a power consumption of a discharging transistor is obtained from multiplying a current by a difference between the voltage of the drive signal and the ground voltage. The power consumption of each transistor increases. Accordingly, the need for a technique of reducing the power consumption is mounting. Japanese Unexamined Patent Application Publication No. JP-A-2006-272907 discloses a technique of reducing power consumption caused by driving current.

A driving circuit disclosed in Japanese Unexamined Patent Application Publication JP-A-2006-272907 generates an auxiliary drive signal that is offset by a predetermined amount in a manner such that the auxiliary drive signal becomes similar to a main trapezoidal drive signal that drives a piezoelectric element. The auxiliary drive signal is used as a power source voltage in order to reduce a difference between the main drive signal and the auxiliary drive signal. The power consumption is thus reduced.

The driving circuit thus includes a main drive signal generator that generates the main drive signal for a transistor pair in response to an analog signal, and an auxiliary drive signal generator that generates the auxiliary drive signal in response to a pulse signal with another transistor and a smoothing circuit. A comparator in a pulse-width modulation (PWM) circuit is used to obtain the pulse signal by comparing a signal representing the main drive signal with a triangular wave.

The PWM circuit of the driving circuit disclosed in Japanese Unexamined Patent Application Publication JP-A-2006-272907 adds an offset value to a signal to be compared with the triangular signal so that the signal to be compared has an offset to the main drive signal. A delay or the like in the smoothing circuit reduces the difference between the main drive signal and the auxiliary drive signal, and the operation of the PWM may be unstable. The frequency of the main drive signal has been higher and higher recently, and the effect of delay cannot be neglected accordingly. If the offset value between the main drive signal and the auxiliary drive signal is set to be larger from the start, the reduction of the power consumption by reducing a thermal loss in the transistor pair becomes difficult to achieve.

SUMMARY

An advantage of some aspects of the invention is that a capacitive load driving circuit operates in a high frequency region with the power consumption thereof reduced.

According to one aspect of the invention, a driving circuit that drives a capacitive load, includes a drive signal generator that generates a drive signal that drives the capacitive load via a transistor pair in response to an analog signal, a power-source voltage generator that generates a high-voltage power-source voltage and a low-voltage power-source voltage and that supplies the high-voltage power-source voltage and the low-voltage power-source voltage respectively to collectors of the transistors of the transistor pair via a high-voltage output terminal and a low-voltage output terminal. The power-source voltage generator includes multiple power sources connected in parallel, a backcurrent prevention diode connected between the adjacent power sources, and a switch unit that connects the adjacent power sources in series under the on-off control of a controller each time the drive signal rises above a predetermined threshold value or falls below a predetermined threshold value. The driving circuit further includes a voltage controlling capacitor that is connected to the low-voltage output terminal of the power source, and a power recovery unit that includes a switch unit that recovers a charge accumulated in the voltage controlling capacitor back to the power source via the high-voltage output terminal.

In accordance with the above-described aspect of the invention, the high-voltage power-source voltage and the low-voltage power-source voltage are easily generated in only the switching operation of the switch unit that causes the high-voltage power-source voltage and the low-voltage power-source voltage to follow a change in the drive signal.

The driving circuit reduces a difference between the drive signal and each of the high-voltage power-source voltage and the low-voltage power-source voltage. The power consumption of the transistor pair resulting from the difference is reduced accordingly. The reduction of the power consumption is easily achieved by increasing the number of stages of power sources.

The driving circuit is free from the adjustment of an offset value that accounts for a delay in the smoothing circuit and the like. The desired high-voltage power-source voltage and low-voltage power-source voltage are easily obtained by simply controlling the switch unit in the on-off control at a predetermined switching timing. The driving circuit can thus appropriately respond to a higher frequency drive signal.

The voltage controlling capacitor is connected to the low-voltage output terminal of the power source to maintain the low-voltage output terminal at a predetermined voltage level. The low-voltage output terminal is prevented from floating in voltage in response to a state of the switch unit during the recovery of the power from the capacitive load. The low-voltage output terminal is thus maintained at a predetermined voltage level. The generation of noise is thus effectively controlled at switching operations.

The charge accumulated in the voltage controlling capacitor is recovered back to the power source via the high-voltage output terminal. The power consumption of the power-source voltage generator is reduced accordingly.

The power-source voltage generator may include a voltage source and multiple capacitors connected in parallel with the voltage source. The power-source voltage generator is thus constructed of a multiple stages of charge pumps connected in tandem. With this arrangement, the driving circuit can further recover power from the capacitive load via the low-voltage output terminal. The multiple stages of charge pumps are easily constructed, and achieve a pronounced power consumption reduction effect in the transistor pair.

The driving circuit may include a resistor-capacitor (RC) time constant circuit including the voltage controlling capacitor and a resistor connected to the voltage controlling capacitor. With the RC time constant circuit, voltage fluctuations at the switching operation are further smoothed.

The capacitive load preferably includes a piezoelectric element of a fluid ejecting head that ejects a fluid through a nozzle aperture in response to a displacement of the piezoelectric element caused by an applied voltage. The piezoelectric element of the fluid ejecting head typically uses a drive signal that is a combination of trapezoidal waves. This is because the high-voltage power-source voltage and the low-voltage power-source voltage, similar to the shape of the drive signal, are easily generated with a predetermined offset amount maintained.

According to another aspect of the invention, the fluid ejecting device includes the driving circuit that controls the capacitive load. The fluid ejecting device can thus operate on a low power consumption.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
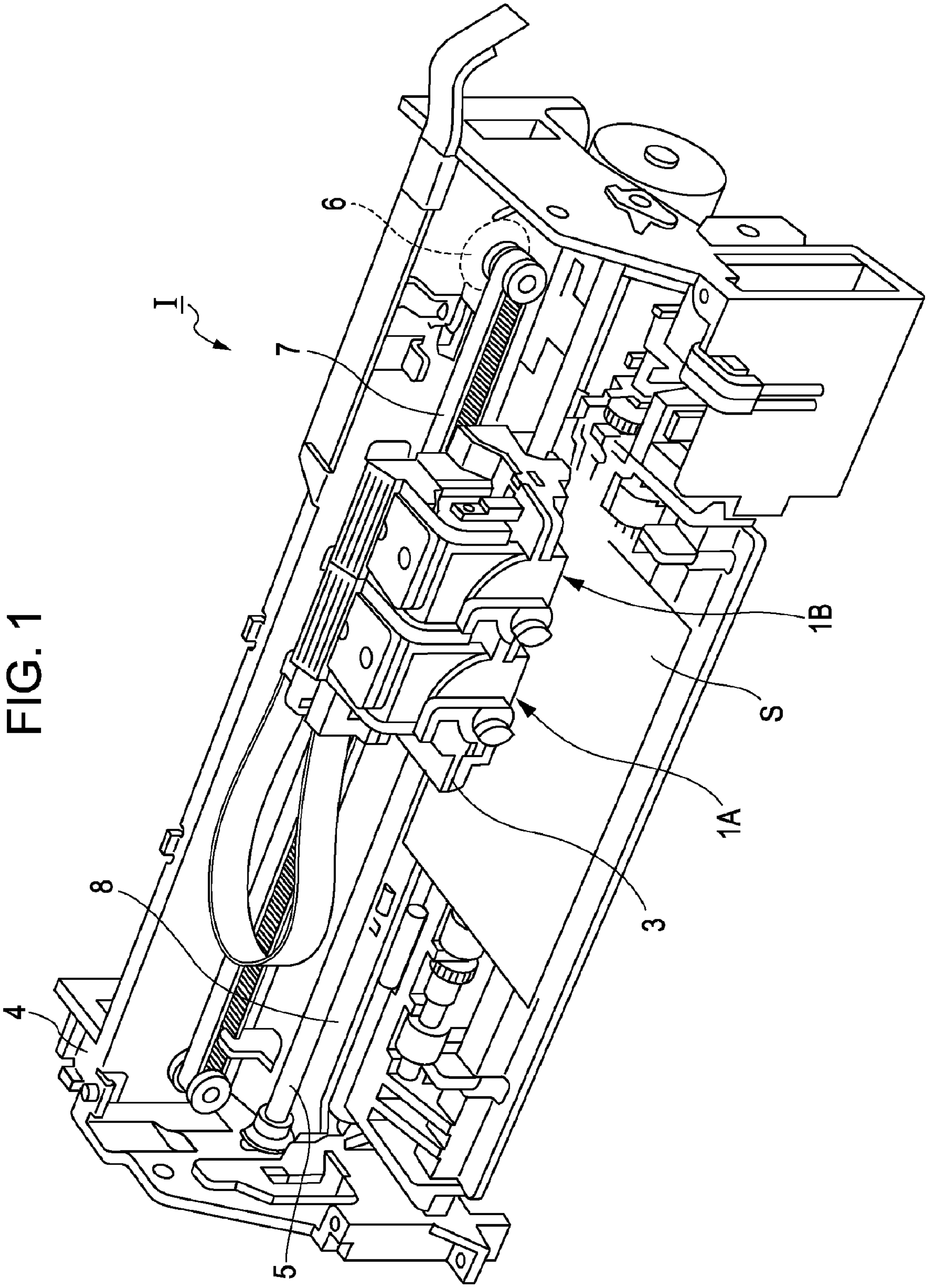
FIG. 1 diagrammatically illustrates a fluid ejecting device of one embodiment of the invention.

FIG. 1 illustrates an ink jet recording device I in accordance with one embodiment of the present invention. As illustrated in FIG. 1, head units 1A and 1B are arranged on the ink jet recording device I operating as a fluid ejecting device. The head units 1A and 1B are mounted on a carriage 3 of the ink jet recording device I. The carriage 3 is supported on a carriage shaft 5 fixed on a device body 4 of the ink jet recording device I in a manner such that the carriage 3 is slidably movable along the axis of the carriage shaft 5. The head units 1A and 1B eject a black ink compound and a color ink compound, respectively.

A driving force of a drive motor 6 is conveyed to the carriage 3 via a plurality of gears (not shown) and a timing belt 7 so that the carriage 3 having the head units 1A and 1B is moved on and along the carriage shaft 5. A platen 8 is arranged along the carriage shaft 5 on the device body 4. A recording sheet S (recording medium) including a sheet of paper supplied by a paper feed roller (not shown in FIG. 1) is wrapped around a platen 8 and then transported.

Figure 2:
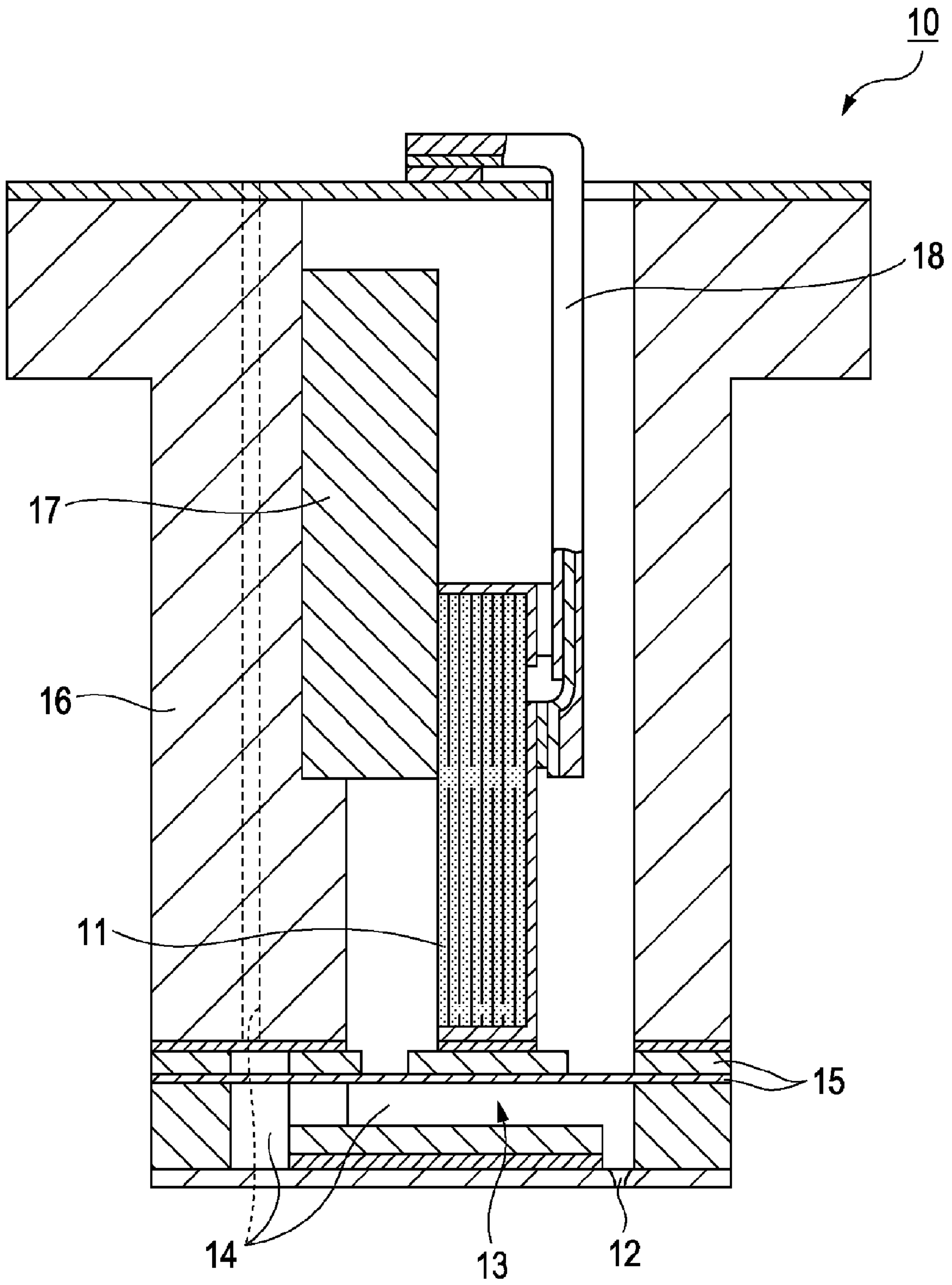
FIG. 2 is a sectional view illustrating a fluid ejecting head of the ejecting device.

FIG. 2 is a sectional view diagrammatically illustrating an ink jet recording head 10 contained in each of the head units 1A and 1B illustrated in FIG. 1. The ink jet recording head 10 includes a pressure generating chamber 13 communicating with a nozzle aperture 12 through which ink is ejected, a passage 14 that allows the pressure generating chamber 13 to communicate with an ink cartridge (not shown) vibration plates 15 facing the pressure generating chamber 13, and piezoelectric elements 11 that cause a change in pressure in the pressure generating chamber 13 by means of the vibration plates 15. The piezoelectric elements 11 are secured to a case 16 via a fixing plate 17. A wiring 18 is attached to one side of one end portion of the piezoelectric elements 11 opposed to the other side in contact with the fixing plate 17. The wiring 18 supplies a drive signal S2 (see FIG. 3) to the piezoelectric elements 11. The wiring 18 is connected to a head controller 30 (see FIG. 3). In the ink jet recording head 10, the drive signal S2 is sent from the head controller 30 to the ink jet recording head 10 via the wiring 18. The drive signal S2 is thus supplied to the piezoelectric elements 11. In response to the drive signal S2, the piezoelectric elements 11 repeat charging and discharging operations in response to the drive signal S2, thereby changing the vibration plates 15 in the shape thereof. The piezoelectric elements 11 thus change the volume of the pressure generating chamber 13. Ink drops are ejected through the predetermined nozzle aperture 12 in response to the change in the volume of the pressure generating chamber 13.

Figure 3:
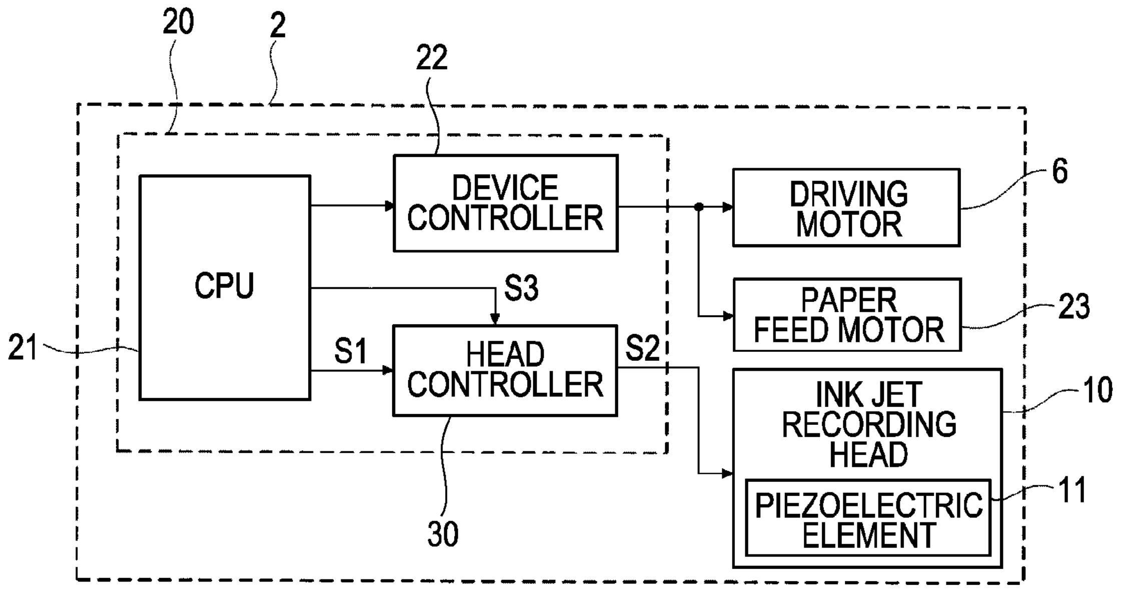
FIG. 3 is a block diagram illustrating a control system of the fluid ejecting device.

FIG. 3 is a block diagram illustrating a control system of the ink jet recording device I. As illustrated in FIG. 3, a control unit 20 arranged in the ink jet recording device I controls the ink jet recording device I. The control unit 20 includes a central processing unit (CPU) 21, a device controller 22, and a head controller 30 serving as a driving circuit for a capacitive load.

When a signal indicative of the movement of the carriage 3 (see FIG. 1) is input from the CPU 21 to the device controller 22, the device controller 22 operates the driving motor 6, thereby moving the carriage 3 along the carriage shaft 5. A signal indicative of a transportation of the recording sheet S is also input from the CPU 21 to the device controller 22. The device controller 22 drives a paper feed motor 23, thereby transporting the recording sheet S.

The head controller 30 receives from the CPU 21 an analog signal S1 for generating the drive signal S2 of the head, and a switching signal S3 for switch-controlling the head controller 30 (as will be described later). In response to the drive signal S2, the head controller 30 selectively drives the piezoelectric elements 11 of the ink jet recording head 10, thereby ejecting ink. Here in the ink jet recording head 10, a driver IC (not shown) receiving a head control signal from the CPU 21 selectively drives the piezoelectric elements 11.

Figure 4:
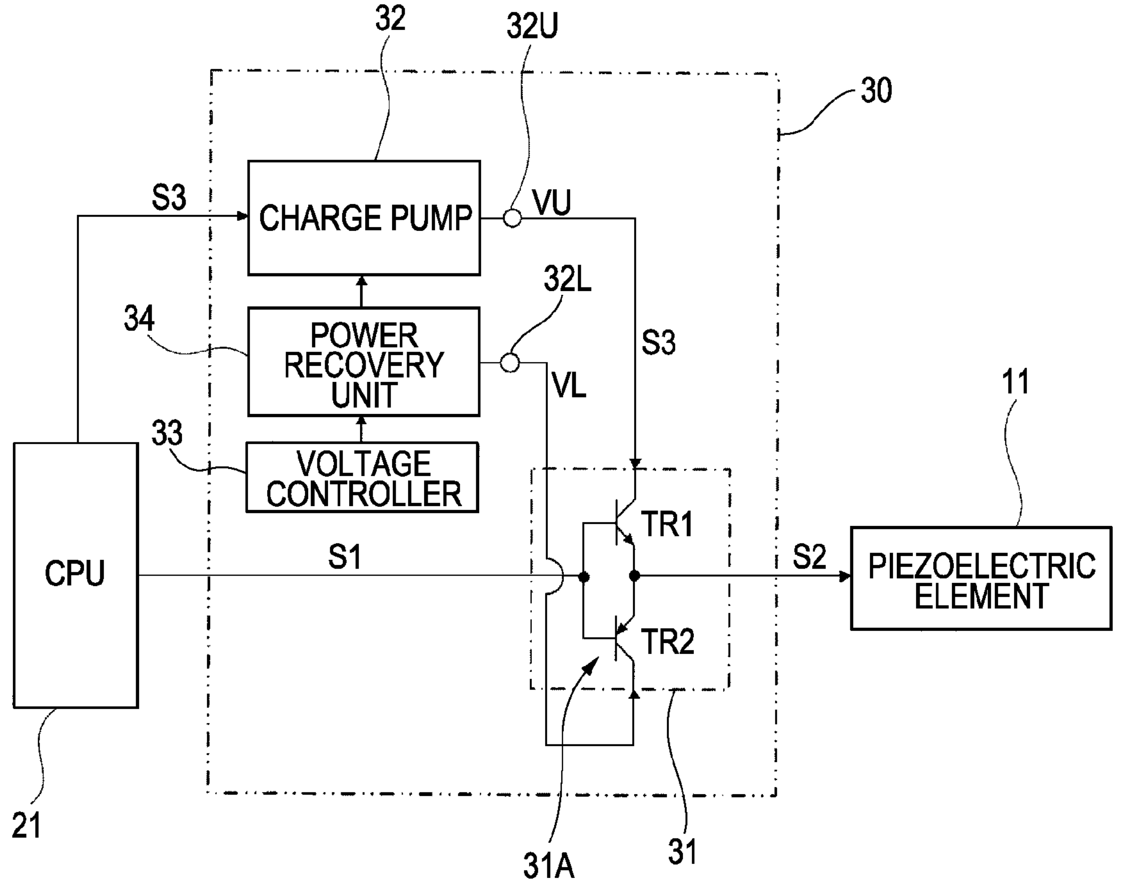
FIG. 4 is a block diagram illustrating a head controller.

FIG. 4 is a block diagram illustrating in detail the head controller 30 controlling the ink jet recording head 10. As illustrated in FIG. 4, the head controller 30 includes a transistor pair 31A as a drive signal generating unit 31 in this embodiment for generating the drive signal S2 (see FIG. 3), a charge pump 32 and a voltage controller 33, serving as a power source voltage generator for generating a high-voltage power-source voltage VU and a low-voltage power-source voltage VL.

The transistor pair 31A generates the drive signal S2 in response to the analog signal S1 applied to the bases of an NPN transistor TR1 and a PNP transistor TR2, forming the transistor pair 31A. The CPU 21 results in the analog signal S1 by digital-to-analog converting the digital data of the drive signal S2 stored on the CPU 21.

The charge pump 32 is composed of multiple stages as described later. Through switching control responsive to the switching signal S3 output from the CPU 21, the charge pump 32 supplies, to collectors of the transistor TR1 and the transistor TR2, the high-voltage power-source voltage VU and the low-voltage power-source voltage VL via a high-voltage output terminal 32U and a low-voltage output terminal 32L, respectively. The collectors of the transistor TR1 and the transistor TR2 respectively receive the high-voltage power-source voltage VU and the low-voltage power-source voltage VL, each of which changes stepwise in a ramp fashion at a plurality of voltage levels responsive to the number of stages of the charge pump 32. The charge pump 32 performs the switching control so that the high-voltage power-source voltage VU remains above the voltage value of the drive signal S2 and so that the low-voltage power-source voltage VL remains below the voltage of the drive signal S2.

The voltage controller 33 is connected to the low-voltage output terminal 32L to maintain the low-voltage output terminal 32L at a predetermined voltage level. The specific structure of the voltage controller 33 will be described later. A power recovery unit 34 includes a plurality of switch units (not shown in FIG. 4). The power recovery unit 34 is on-off controlled in response to the switching signal S3 output from the CPU 21 so that the charge accumulated on the voltage controller 33 is recovered to the charge pump 32 via the high-voltage output terminal 32U.

In the head controller 30, the analog signal S1 generated by the CPU 21 is input to the bases of the transistors TR1 and TR2 of the transistor pair 31A. As a result, the transistor pair 31A amplifies the analog signal S1, thereby generating the drive signal S2 enough to supply sufficient current to operate concurrently a large number of piezoelectric elements 11.

The transistor pair 31A is a push-pull amplifier circuit composed of the transistors TR1 and TR2 connected in a complementary fashion. The use of such an amplifier achieves a high current amplification factor. More specifically, the transistor pair 31A is constructed of the NPN transistor TR1 and the PNP transistor TR2 with emitters thereof connected to each other. The transistor TR1 operates when the voltage of the drive signal S2 rises, and serves a transistor charging the piezoelectric elements 11. The transistor TR1 receives the high-voltage power-source voltage VU at the collector thereof. On the other hand, the PNP transistor TR2 operates when the voltage of the drive signal S2 falls, and serves as a transistor discharging the piezoelectric elements 11. The transistor TR2 receives the low-voltage power-source voltage UL at the collector thereof.

The transistors TR1 and TR2, with the emitters thereof connected to each other at a junction, outputs the drive signal S2 from the junction thereof to the piezoelectric elements 11.

The transistor pair 31A is controlled by the analog signal S1 input to the bases of the transistors TR1 and TR2. For example, the voltage of the analog signal S1 is now rising. When the base voltage of the transistor TR1 rises above the emitter voltage by a predetermined value, the transistor TR1 is turned on. The voltage of the drive signal S2 also rises. For example, the voltage of the analog signal S1 is now falling. When the base voltage of the transistor TR2 falls below the emitter voltage thereof by a predetermined value, the transistor TR2 is turned on. The voltage of the drive signal S2 also falls. In this way, the drive signal S2 is controlled so that the waveform thereof becomes similar to the voltage waveform of the analog signal S1.

In accordance with the embodiment, the switching control to the charge pump 32 is performed so that the stepwise high-voltage power-source voltage VU and low-voltage power-source voltage VL having a stepwise shape similar to the drive signal S2 are generated. The high-voltage power-source voltage VU and the low-voltage power-source voltage VL are used as power source voltages to the transistor pair 31A. The high-voltage power-source voltage VU constantly has a value higher than the drive signal S2 and the low-voltage power-source voltage VL constantly has a value lower than the drive signal S2, and each voltage changes in a stepwise fashion similar to the waveform of the drive signal S2. The difference between each of the high-voltage power-source voltage VU and the low-voltage power-source voltage VL and the drive signal S2 is reduced. As a result, the power consumption of the transistor pair 31A is reduced.

Figure 5:
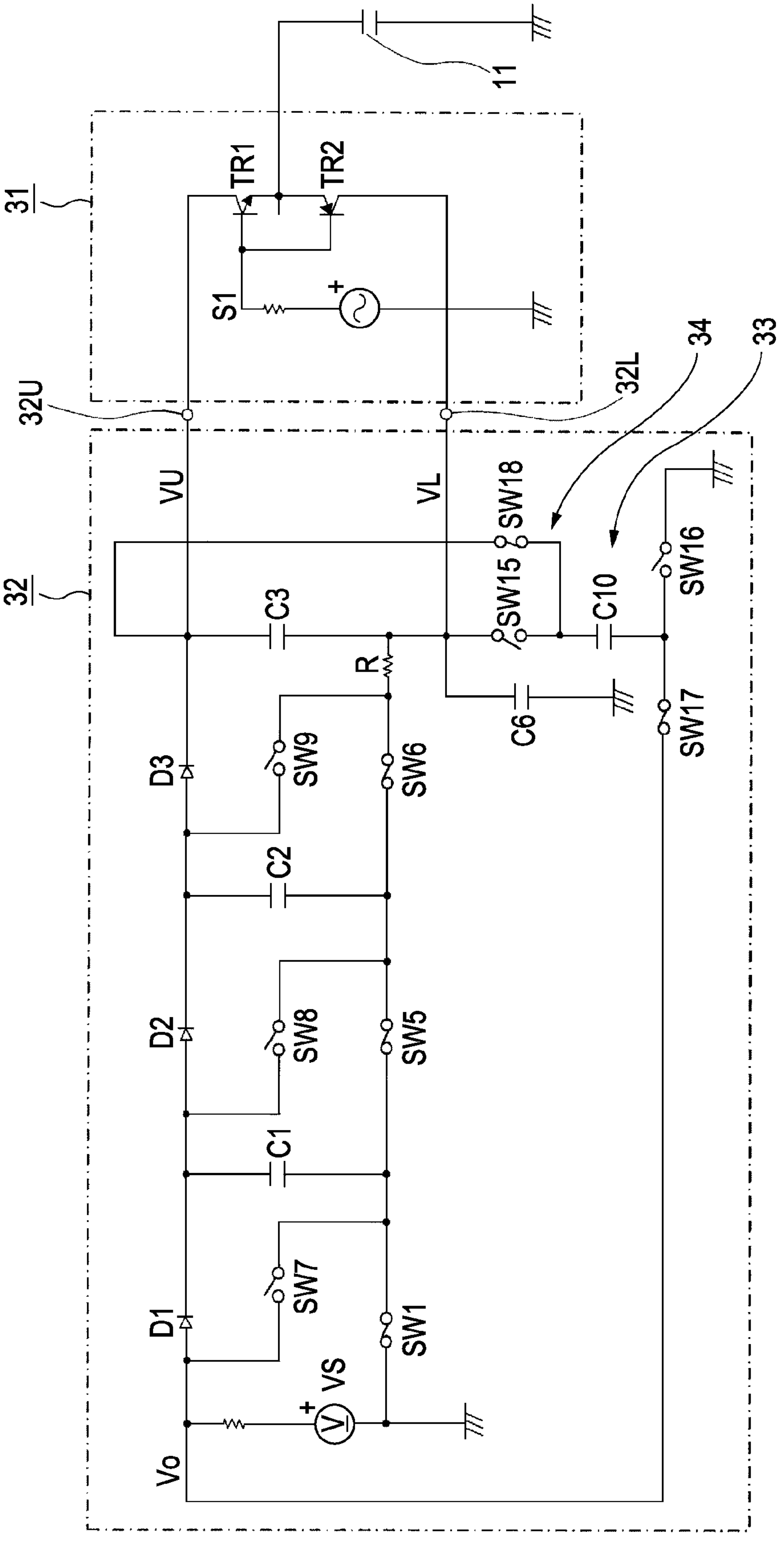
FIG. 5 is a circuit diagram illustrating a specific circuit of the head controller.
Figure 6:
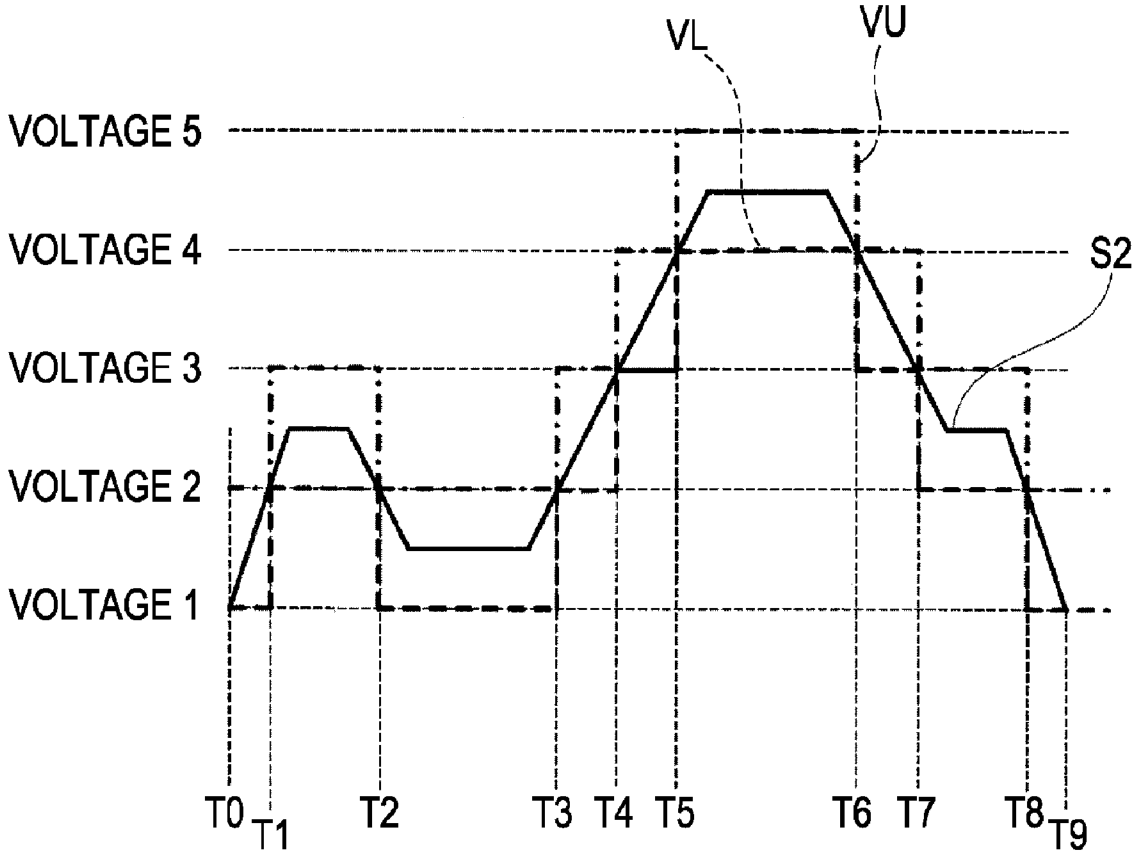
FIG. 6 is a waveform diagram illustrating a relationship of a drive signal, a high-voltage power-source voltage and a low-voltage power-source voltage.

FIG. 5 is a circuit diagram of the head controller 30 including the charge pump 32 in accordance with one embodiment of the invention. FIG. 6 is a waveform diagram illustrating the relationship between the drive signal S2 as the output of the head controller 30 and each of the high-voltage power-source voltage VU and the low-voltage power-source voltage VL. In FIG. 5, elements identical to those illustrated in FIG. 4 are designated with the same reference numerals, and the discussion thereof are omitted.

Referring to FIG. 5, the charge pump 32 is a three-stage charge pump including capacitors C1, C2, and C3, one for each stage thereof. The capacitors C1, C2, and C3 are connected in parallel with a power source VC. Backcurrent prevention diodes D1, D2, and D3 are connected to adjacent capacitors C1, C2, and C3 in a pi network configuration. Also connected are switches SW7, SW1, SW8, SW5, SW9, and SW6. A combination of on and off operations of the switches SW7, SW1, SW8, SW5, SW9, and SW6 causes one of voltage 1 through voltage 4 on the low-voltage output terminal 32L (see FIG. 6), and one of voltage 2 through voltage 6 on the high-voltage output terminal 32U (see FIG. 6). The voltage 1 is the ground voltage, and the voltage 2 is an output voltage Vo of the voltage source VS. Furthermore, voltage 3=(voltage 2+Vo), voltage 4=(voltage 2+2Vo), and voltage 5=(voltage 2+3Vo). The charge pump 32 is designed to perform a voltage boosting operation from the voltage 2 to the voltage 3 at the first stage, a voltage boosting operation from the voltage 3 to the voltage 4 at the second stage, and a voltage boosting operation from the voltage 4 to the voltage 5 at the third stage. As a result, the voltage 2 through the voltage 5 are selectively applied to the collector of the transistor TR1 via the high-voltage output terminal 32U. The voltages 1 through 4 are selectively applied to the collector of the transistor TR2 via the low-voltage output terminal 32L.

By appropriately controlling the on/off timings of the switches SW1-SW9, the high-voltage power-source voltage VU and the low-voltage power-source voltage VL, having a waveform similar to the waveform of the drive signal S2, are generated as illustrated in FIG. 6. The switching control of the switches SW1-SW9 is performed in response to the switching signal S3 output from the CPU 21. More specifically, during the rise of the drive signal S2, the high-voltage power-source voltage VU is switched to a voltage higher than the current voltage by one level immediately before when the drive signal S2 rises above each of the voltages 2 through 4, and the low-voltage power-source voltage VL is switched to a voltage lower than the current voltage by one level immediately before the drive signal S2 falls below each of the voltages 4 through 2.

The voltage controller 33 of one embodiment of the invention includes capacitors C6 and C10, each connected to the low-voltage output terminal 32L. The capacitor C6 is directly connected between the low-voltage output terminal 32L and the ground. The capacitor 10 is connected between the low-voltage output terminal 32L and the ground via the switch SW15. The capacitor C6 is arranged for the reason discussed below. The C10 is isolated from the low-voltage output terminal 32L by the switch SW15 when the charge accumulated on the capacitor C10 is recovered to the capacitor C3. Without the capacitor C6, the low-voltage output terminal 32L becomes floating in voltage when the switch SW15 is opened. The C6 is thus arranged in order to prevent the voltage of the charge pump 32 from being unstable due to the floating state. The capacitor C6 stays at the same voltage level as the capacitor C10 because of the charging of the accumulated charge from the piezoelectric element 11. The capacitor C6 is preferably as small in capacitance as possible with respect to the capacitor C10 because the charge is drained to the ground when the switches SW1, SW5, and SW6 are closed at an initial state. It is sufficient if the capacitor C6 keeps the low-voltage output terminal 32L at a constant voltage for only the closed period of the switch SW15 throughout which the capacitor C10 is isolated from the low-voltage output terminal 32L.

When power is recovered to the charge pump 32 from the piezoelectric element 11 as the capacitive load, the voltage controller 33 can fix the low-voltage output terminal 32L to a predetermined voltage instead of a floating state. More specifically, if the switches SW9 and SW6 are closed on at the same time, the capacitor C2 is shortcircuited. There is a moment when the two switches SW9 and SW6 are opened. Without the capacitors C6 and C10, the low-voltage output terminal 32L remains floating in terms of voltage, and thereby unfixed. With the capacitors C6 and C10 connected to the low-voltage output terminal 32L, the low-voltage output terminal 32L is maintained at the predetermined voltage and operation of the head controller 30 is thus stabilized. Without both the capacitor C6 and the capacitor C10, irregularities such as the noise generation take place at the switching of the charge pump 32.

In one embodiment of the invention, a resistor R is connected to the capacitors C6 and C10. With the resistor R connected, a RC (resistance-capacitance) time-constant circuit is formed. The RC time-constant circuit causes voltage to smoothly change at voltage switching.

The power recovery unit 34 includes four switches SW15, SW16, SW17, and SW18. To cause the capacitor C10 to function as the voltage controller 33, the switches SW15 and SW16 are closed and the charge pump 32 is maintained at a constant voltage.

During the recovery of the charge from the capacitor C10, the switch SW17 connected between the voltage source VS and the ground side of the capacitor C10 is closed to raise the voltage of the capacitor C10 by the output voltage Vo. The switch SW18 connected between the high-voltage output terminal 32U and the power source side of the capacitor C10 is closed to shift the charge from the capacitor C10 to the capacitor C3. The capacitor C3 is set to be larger in capacitance than the capacitor C10. In accordance with one embodiment of the invention, the capacitance ratio of the capacitor C3 to the capacitor C10 is 10:1. If the charge accumulated in the capacitor C10 is shifted to the capacitor C3, the capacitor C3 rises in voltage by $\frac{1}{10}$ times. Almost all the charge shifted from the capacitor C10 is stored onto the capacitor C3. The power from the capacitor C10 is thus recovered. To achieve such a power recovery, the switches SW15-SW18 are on-off controlled at a predetermined timing. Such an on-off control process is performed in response to the switching signal S3 output from the CPU 21 (see FIG. 4). The specific operation of the on-off control process will be described later.

The following Table lists on/off states of the switches SW1-SW18 that are on-off controlled at timings T0 through T9 of FIG. 6. In the Table, waveform periods T0→T1 through T7→T8 represent the switching control operation performed when the high-voltage power-source voltage VU and the low-voltage power-source voltage VL are generated. Waveform periods T8→T91 through T→T910 represent the switching control operation performed when the charge of the capacitor C10 is recovered. The two switching control operations of one embodiment of the invention are described below.

TABLE

| Waveform | Switch number | | | | | | | | |
|---|---|---|---|---|---|---|---|---|---|
| period | SW1 | SW5 | SW6 | SW7 | SW8 | SW9 | SW15 | SW16 | SW17 | SW18 |
| T0→T1 | ON | ON | ON | OFF | OFF | OFF | ON | ON | OFF | OFF |
| T1→T2 | ON | ON | OFF | OFF | OFF | ON | ON | ON | OFF | OFF |
| T2→T3 | ON | ON | ON | OFF | OFF | OFF | ON | ON | OFF | OFF |
| T3→T4 | ON | ON | OFF | OFF | OFF | ON | ON | ON | OFF | OFF |
| T4→T5 | ON | OFF | OFF | OFF | ON | ON | ON | ON | OFF | OFF |
| T5→T6 | OFF | OFF | OFF | ON | ON | ON | ON | ON | OFF | OFF |
| T6→T7 | ON | OFF | OFF | OFF | ON | ON | ON | ON | OFF | OFF |
| T7→T8 | ON | ON | OFF | OFF | OFF | ON | ON | ON | OFF | OFF |
| T8→T91 | ON | ON | OFF | OFF | OFF | OFF | ON | ON | OFF | OFF |
| T8→T92 | ON | ON | OFF | OFF | OFF | OFF | OFF | ON | OFF | OFF |
| T8→T93 | ON | ON | ON | OFF | OFF | OFF | OFF | ON | OFF | OFF |
| T8→T94 | ON | ON | ON | OFF | OFF | OFF | OFF | OFF | OFF | OFF |
| T8→T95 | ON | ON | ON | OFF | OFF | OFF | OFF | OFF | ON | OFF |
| T8→T96 | ON | ON | ON | OFF | OFF | OFF | OFF | OFF | ON | ON |
| T8→T97 | ON | ON | ON | OFF | OFF | OFF | OFF | OFF | OFF | ON |
| T8→T98 | ON | ON | ON | OFF | OFF | OFF | OFF | OFF | OFF | OFF |
| T8→T99 | ON | ON | ON | OFF | OFF | OFF | OFF | ON | OFF | OFF |
| T8→T910 | ON | ON | ON | OFF | OFF | OFF | ON | ON | OFF | OFF |

Switching control operation performed when the high-voltage power-source voltage VU and the low-voltage power-source voltage VL are generated In this switching control operation, the switches SW15-SW18 remain unchanged in the states thereof. More specifically, the capacitor C10 is connected between the low-voltage output terminal 32L and the ground with the switches SW15 and SW16 closed. In this state, the capacitor C10 and the capacitor C6 function together as the voltage controller 33.

In the waveform period T0→T1, the switches SW1-SW9 take the on-off states as listed in the Table. The high-voltage output terminal 32U is at the voltage 2, and the low-voltage output terminal 32L is at the voltage 1. In the waveform period T1→T2, the high-voltage output terminal 32U rises to the voltage 3, and in the waveform period T2→T3, the high-voltage output terminal 32U falls to the voltage 2. In the waveform periods T3→T4 and T4→T5, the high-voltage output terminal 32U successively rises to the voltage 3 and then to the voltage 4. In the waveform period T5→T6, the high-voltage output terminal 32U reaches a maximum voltage V5. In the waveform periods T6→T7, T7→T8, and T8→T9, the high-voltage output terminal 32U successively falls down to the voltage 4, the voltage 3, and then the voltage 2. The low-voltage output terminal 32L follows the voltage kept to be lower than the voltage of the high-voltage output terminal 32U by the output voltage Vo.

As a result, the high-voltage power-source voltage VU takes the waveform denoted by a dot-and-dash chain line, and the low-voltage power-source voltage VL takes the waveform denoted by a broken line.

The switching operations of the switches SW1-SW9 at the timings T1 through T8 are controlled in response to the switching signal S3 generated by the CPU 21 (see FIG. 4). The CPU 21 generates the switching signal S3 by comparing the voltage of the drive signal S2 with the threshold value responsive to the voltages 2 through 4.

Referring to FIG. 6, the high-voltage power-source voltage VU and the low-voltage power-source voltage VL are changed in a stepwise manner in accordance with the waveform of the drive signal S2. The power consumed by the transistor pair 31A is reduced accordingly. It is noted that the consumed power is the sum of an area present between the high-voltage power-source voltage VU and the drive signal S2 and an area present between the low-voltage power-source voltage VL and the drive signal S2 in the embodiment of the invention.

When the drive signal S2 falls, the power accumulated on the piezoelectric elements 11 as the capacitive load is recovered back to the capacitor C2 and the like in the charge pump 32. The consumption of the charge pump 32 is reduced accordingly. Switching control operation when the charge on the capacitor C10 is recovered.

In the waveform period T8→T91, the switch SW9 is changed from a closed state to an opened state. As a result, the low-voltage output terminal 32L is maintained at the voltage of the capacitor C6 and the capacitor C10.

In the waveform period T8→T92, the switch SW15 is changed from a closed state to an opened state. As a result, the capacitor C10 is isolated from the low-voltage output terminal 32L, and the capacitor C6 continuously maintains the low-voltage output terminal 32L at a predetermined voltage.

In the waveform period T8→T93, the switch SW6 is changed from a closed state to an opened state. The head controller 30 returns to the initial state thereof.

In the waveform period T8→T94, the switch SW16 is changed from a closed state to an opened state. As a result, the capacitor C10 becomes isolated from the ground voltage, thereby shifting into a floating state.

In the waveform period T8→T95, the switch SW17 is changed from an opened state to a closed state. As a result, the output voltage Vo of the voltage source VS is superimposed on the voltage of the capacitor C10.

In the waveform period T8→T96, the switch SW18 is changed from an opened state to a closed state. Since the capacitor C10 is higher in voltage than the capacitor C3, the charge of the capacitor C10 shifts to the capacitor C3 via the high-voltage output terminal 32U. Since the capacitor C3 is higher in capacitance than the capacitor C10, almost all of the charge shifted from the capacitor C10 is stored on the capacitor C3. The power is thus recovered from the capacitor C10.

In the waveform period T8→T97, the switch SW17 is changed from a closed state to an opened state. As a result, the capacitor C10 is isolated from the voltage source VS.

In the waveform period T8→T98, the switch SW18 is changed from a closed state to an opened state. As a result, the capacitor C10 becomes floating.

In the waveform period T8→T99, the switch SW16 is changed from an opened state to a closed state. As a result, one end of the capacitor C10 is grounded.

In the waveform period T8→T910, the switch SW15 is changed from an opened state to a closed state. As a result, the head controller 30 returns to the initial state. The capacitor C10 is connected between the low-voltage output terminal 32L and the ground. Since the switches SW1-SW6 are on the closed state, the charge on the capacitor C10 is drained to the ground, but the amount of drained charge is extremely small. This is because the charge has been shifted to the capacitor C3. Through the voltage control, almost all of the charge accumulated on the capacitor C10 is recovered to the capacitor C3.

In accordance with embodiments of the invention, the high-voltage power-source voltage VU and the low-voltage power-source voltage VL, each following the change in the drive signal S2, are easily generated by the switching operations of the switches SW1-SW9.

The difference of each of the high-voltage power-source voltage VU and the low-voltage power-source voltage VL and the drive signal S2 is reduced. The power consumption of the transistor pair 31A caused by the difference is thus reduced.

The capacitor C3 and the capacitor C10, forming the voltage controller 33, are connected to the low-voltage output terminal 32L to maintain the voltage of the low-voltage output terminal 32L at a predetermined voltage. When power is recovered from the piezoelectric elements 11 as the capacitive load, the low-voltage output terminal 32L is prevented from floating. The voltage of the low-voltage output terminal 32L is maintained at the constant voltage. Noise at the switching is thus effectively controlled.

The charge accumulated on the voltage controlling capacitor C10 is recovered to the capacitor C3 in the charge pump 32 via the high-voltage output terminal 32U. The power consumption of the power-source voltage generator is reduced accordingly.

In accordance with embodiments of the invention, the three stages are connected in tandem. The invention is not limited to this arrangement. Any type of structure is perfectly acceptable as long as the structure allows a multiple stages of power sources to be connected in tandem so that a plurality of voltage levels are picked up at the high-voltage output terminal and the low-voltage output terminal. There is no limitation to the number of stages of charge pumps. The more the number of stages, the more faithfully the high-voltage power-source voltage VU and the low-voltage power-source voltage VL become similar to the drive signal S2. The power consumed by the transistor pair 31A is more effectively reduced.

In the above-described embodiments, the drive signal S2 is input to the longitudinal vibration piezoelectric elements 11. The pressure generating unit for generating a change in pressure in the pressure generating chamber 13 is not limited to the piezoelectric elements 11. For example, the invention is applicable to a thick-film actuator device manufactured by bonding a green sheet, a thin-film piezoelectric element, etc.

What is claimed is:

1. A driving circuit that drives a capacitive load, comprising:

a drive signal generator that generates a drive signal that drives the capacitive load via a transistor pair in response to an analog signal;

a power-source voltage generator that generates a high-voltage power-source voltage and a low-voltage power-source voltage and that supplies the high-voltage power-source voltage and the low-voltage power-source voltage respectively to collectors of the transistors of the transistor pair via a high-voltage output terminal and a low-voltage output terminal, the power-source voltage generator including multiple power sources connected in parallel, a backcurrent prevention diode connected between the adjacent power sources, and a first switch unit that connects the adjacent power sources in series under the on-off control of a controller each time the drive signal rises above a predetermined threshold value or falls below a predetermined threshold value;

a voltage controlling capacitor that is connected to the low-voltage output terminal of the power source; and a power recovery unit that includes a second switch unit that recovers a charge accumulated in the voltage controlling capacitor back to the power source via the high-voltage output terminal.

2. The driving circuit according to claim 1, wherein the power-source voltage generator comprises a voltage source and multiple capacitors connected in parallel with the voltage source.

3. The driving circuit according to claim 1, comprising a resistor-capacitor time constant circuit including the voltage controlling capacitor and a resistor connected to the voltage controlling capacitor.

4. The driving circuit according to claim 1, wherein the capacitive load comprises a piezoelectric element of a fluid ejecting head that ejects a fluid through a nozzle aperture in response to a displacement of the piezoelectric element caused by an applied voltage.

5. A fluid ejecting device comprising the driving circuit according to claim 4.

* * * * *